, 
United States Patent
Barkowski et al.

(10) Patent No.: US 11,018,301 B2
(45) Date of Patent: May 25, 2021

(54) CONTACTING OPTOELECTRONIC COMPONENTS

(71) Applicant: INURU GMBH, Berlin (DE)

(72) Inventors: Patrick Barkowski, Berlin (DE); Marcin Ratajczak, Berlin (DE)

(73) Assignee: INURU GMBH, Berlin (DE)

( * ) Notice: Subject to any disclaimer, the term of this patent is extended or adjusted under 35 U.S.C. 154(b) by 0 days.

(21) Appl. No.: 16/335,476

(22) PCT Filed: Sep. 27, 2017

(86) PCT No.: PCT/EP2017/074514
§ 371 (c)(1),
(2) Date: Apr. 25, 2019

(87) PCT Pub. No.: WO2018/060258
PCT Pub. Date: Apr. 5, 2018

(65) Prior Publication Data
US 2019/0245144 A1    Aug. 8, 2019

(30) Foreign Application Priority Data

Sep. 27, 2016  (DE) .................. 10 2016 118 186.2

(51) Int. Cl.
*H01L 51/52*    (2006.01)
*H01L 51/00*    (2006.01)
(Continued)

(52) U.S. Cl.
CPC ........ *H01L 51/0022* (2013.01); *H01L 51/441* (2013.01); *H01L 51/5203* (2013.01);
(Continued)

(58) Field of Classification Search
CPC ............. H01L 51/5215; H01L 51/5528; H01L 51/441; H01L 51/0022; H01L 51/5203;
(Continued)

(56) References Cited

U.S. PATENT DOCUMENTS

2006/0276096 A1* 12/2006 Wang ................. H01L 51/0024
445/2
2015/0200664 A1* 7/2015 Kim .................... H03K 17/962
200/5 R
2018/0301648 A1* 10/2018 Rantala ................ H01L 51/442

FOREIGN PATENT DOCUMENTS

| KR | 20160074324 A | 6/2016 |
| WO | 2010150648 A1 | 12/2010 |
| WO | 2014032642 A1 | 3/2014 |

OTHER PUBLICATIONS

3M Electronics Materials Solutions Division, "3M Electrically Conductive Double-Sided Tape 9722S Series", Technical Data, Mar. 2016, 4 pages, © 2016 3M; https://multimedia.3m.com/mws/media/1197562O/3m-electrically-conductive-double-sided-tape-9722s-series.pdf.

(Continued)

*Primary Examiner* — David Vu
*Assistant Examiner* — Brandon C Fox
(74) *Attorney, Agent, or Firm* — Blue Filament Law PLLC

(57) ABSTRACT

A method for the contacting of electrodes with conductor tracks by means of a conductive paste and/or adhesive-coated conductive fiber composites is provided. Furthermore, an electronic component whose electrodes are connected by means of a conductive paste and/or adhesive-coated conductive fiber composites is provided.

19 Claims, 2 Drawing Sheets

(51) Int. Cl.
  *H01L 51/44* (2006.01)
  *H01L 51/56* (2006.01)
(52) U.S. Cl.
  CPC ...... *H01L 51/5206* (2013.01); *H01L 51/5212* (2013.01); *H01L 51/5221* (2013.01); *H01L 51/5228* (2013.01); *H01L 51/56* (2013.01)
(58) Field of Classification Search
  CPC .. H01L 51/5206; H01L 51/5221; H01L 51/56
  USPC .......................................................... 257/76
  See application file for complete search history.

(56) References Cited

OTHER PUBLICATIONS

English translation of International Search Report dated Mar. 7, 2018 for International Application No. PCT/EP2017/074514 filed Sep. 27, 2017.

* cited by examiner a b

Contacting from above with paste

Contacting from above without paste

Contacting of different components

CONTACTING OPTOELECTRONIC COMPONENTS

The invention describes a method for the contacting of electrodes with conductor tracks by means of a conductive paste and/or with adhesive-coated conductive fiber composites. Furthermore, the invention relates to an electronic component whose electrodes are connected by means of a conductive paste and/or with adhesive-coated conductive fiber composites.

BACKGROUND AND PRIOR ART

The invention relates to the field of electronic components. Preferably electronic components having optoelectronic components.

Optoelectronic components, such as those with an organic basis, but also hybrid components made from organic and inorganic layers, are used in many areas of technology.

Organic light-emitting diodes (OLEDs) usually consist of a sandwich structure, wherein several layers of organic semiconductor materials are usually located between two electrodes. In particular, an OLED comprises one or more emitter layers (EL), in which electromagnetic radiation is generated, preferably in the visible range, by a recombination of electrons and holes. The electrons and holes are provided respectively by a cathode and anode, while preferably so-called injection layers facilitate the process by lowering the injection barrier. OLEDs therefore usually have electron and hole injection layers. Furthermore, OLEDs generally have hole transport layers (HTL) or electron transport layers (ETL)), which support the direction of diffusion of the electrons and holes toward the emitter layer. In OLEDs, these layers are composed of organic materials; in hybrid optoelectronic components, the layers may consist partly of organic and partly of inorganic materials. In the sense of the invention, the term OLED shall also preferably mean hybrid LEDs.

As compared to traditional inorganic LEDs, OLEDs are distinguished by a thin and flexible layered structure. For this reason, OLEDs have distinctly more diversified uses than classical inorganic LEDs. Thanks to their flexibility, OLEDs can be readily used for example for monitor screens or electronic paper.

The advantageous properties of optoelectronic components comprising organic semiconductor materials for the generating of light in OLEDs may also be used for the generating of electric current. Thus, organic solar cells are likewise characterized by a thin layered structure, which substantially increases the possible applications as compared to classical inorganic solar cells. The structure of organic solar cells or hybrid solar cells has similarities to OLEDs.

Instead of an emitter layer, however, one or more absorber layers are present as the photoactive layer. In the absorber layer, electron/hole pairs are generated by incoming electromagnetic radiation as free charge carriers. The other layers comprise electron and hole transport layers as well as electron extraction and hole extraction layers. These consist of organic materials or, in the case of hybrids, organic and inorganic materials whose electrochemical potentials are shifted, as donor and acceptor layers, so that they generate an internal field in the solar cell, which takes away the free charge carriers to the electrodes. The incident electromagnetic radiation thus provides electrons at the cathode and holes at the anode to generate a voltage or a current. In the sense of the invention, organic solar cells will also preferably mean hybrid solar cells.

Thanks to the thin layered structure, organic solar cells can be manufactured in favorable manner and be applied as a broad surface film coating on buildings.

In order to place both OLEDs and organic solar cells in operation, it is necessary for their electrodes to make contact with conductor tracks or cables. In the case of the OLEDs, the anode and cathode are connected via conductor tracks or cables to a voltage source, which provides the electric energy for the luminous output of the OLEDs. In organic solar cells, the electrodes are galvanically connected to a power consumer, such as a chargeable battery, or also to an OLED.

In the prior art, it is known how to use conventional soldering to connect the electrodes to cables or conductor tracks. Due to the high temperatures, however, this may result in a damaging of the optoelectronic components, i.e., the OLED or the organic solar cell. This is especially the case as regards printed OLEDs or organic solar cells, since these are particularly heat-sensitive. Printed conductor tracks may also be destroyed or dissolved by conventional solder methods.

Furthermore, it is known in the prior art how to employ flexible contacting methods which do not use conventional solder methods. In this case, the electronic components are usually applied and connected on flexible plastic substrates, such as polyimide films. In English, the technology is known as flexible electronic circuits (FPC). Therefore, FPC cables are also used for the contacting of OLEDs or organic solar cells to conductor tracks. In this case, conductive adhesives are used for the connecting of the electrodes to the FPC cables. The drawback to this method, however, is the large time expense due to the drying of the adhesives. Furthermore, high temperatures and at times high pressure are required, which may destroy the component.

The Problem of the Invention

One problem which the invention proposes to solve is to provide a method which eliminates the drawbacks of the prior art. In particular, one problem of the invention was to provide a method for the contacting of electrodes, preferably of OLEDs or organic solar cells, which ensures a stable connection, can be implemented quickly and cost effectively, and is gentle to sensitive electronic components. Furthermore, one problem of the invention was to provide a corresponding electronic component comprising an OLED or an organic solar cell in which a stable and cost-effective contacting of the electrodes with the conductor tracks occurs.

SUMMARIZATION OF THE INVENTION

The problem according to the invention is solved by the independent claims for an electronic component and for methods of contacting of electrodes with conductor tracks. The dependent claims relate to preferred embodiments of the invention.

In one preferred embodiment, the invention relates to an electronic component comprising at least one electrode and at least one conductor track, wherein a layer of a conductive paste is present on the electrode, by means of which a contacting to the conductor track occurs.

In the sense of the invention, the electronic component preferably means an arrangement of electronic components comprising at least one electrode and one conductor track. The electronic component may comprise both optoelectronic thin-layer components, such as OLEDs, or organic solar cells. But it may also be preferable for the electronic component to comprise other conventional components, such as microchips, circuit boards, preferably outfitted with an electronic switching, etc. In the sense of the invention, electrode preferably means a conductive material, which needs to be connected to a conductor track in order to operate. In the case of OLEDs or organic solar cells, the electrodes are preferably the anode and cathode. The cathode in this preferred embodiment serves as the electron supplier. Preferably, the cathode has a slight surface resistance, so as to make possible the most uniform possible injection or extraction of electrons across the surface of the OLED or the organic solar cell. The anode is preferably the hole supplier and it therefore preferably has a significantly higher work function than the cathode. Furthermore, it is preferable for the anode to have a high surface conductivity for holes. In the case of other conventional components, such as a microchip or a circuit board, the electrodes are preferably those conductive contacts which are connected to the conductor tracks. In the sense of the invention, conductor tracks are preferably strips made from a conductive material, preferably having a greater length than width, and serving for the connecting of electronic components. Preferably, the conductor tracks have a slight thickness of substantially less than 0.5 mm and they can be produced for example with the aid of printing processes. But it may also be preferable for the contacting according to the invention to occur directly between two electrodes, whereby no additional conductor track is needed, or an electrode corresponds to the conductor track.

It was totally surprising that a stable and effective contacting of electrodes to the conductor tracks can be accomplished by means of a conductive paste, preferably a silver paste, a copper paste, a carbon paste or a graphite paste. A paste is primarily a soft, shapeable mass, a mixture of solid and liquid (suspension), having a high content of solids and being more spreadable than flowable. The electrodes of the prior art have too smooth a surface structure to allow a direct contacting with conductor tracks. Contacting means first and foremost the making of an electrical contact or an electrical connection between the contacting elements, so that electrons and/or holes can move between these elements and an electric current can flow. It was known that a conductive paste can be used to accomplish a surface modification, i.e., a roughening, in especially simple manner, resulting in a stable contact. Thanks to the additional depositing of the conductive paste on the electrode, the surface of the electrodes becomes rough. That is, the surface preferably has an extension not only in two dimensions, such as a plane, but in three mutually orthogonal spatial directions, so as to create an only partly flat area whose surface is enlarged and comprises structures. There are irregularities, figuratively speaking hills, valleys, peaks or other kinds of irregularities on the electrode. In this way, the effective potential contact area of the electrode is effectively enlarged. In particular, the irregularities result in strong surface bonding for the contact with a conductor track, especially with a printed conductor track, similar to a hooked or Velcro connection on the mesoscopic level. Surprisingly, this form of contacting requires neither high pressure nor elevated temperature. In this way, an especially gentle method can be obtained for the contacting of electrodes with conductor tracks, assuring a long lifetime of the contacts. Hence, a savings of time, material, labor and cost is achieved in the manufacturing process.

The electronic component is thus distinguished by a simple design with little fault susceptibility and enhanced stability. It is particularly robust, reliable, and maintenance-free; defects can be eliminated, and the quality improved.

Furthermore, the effectiveness of the contacting is increased, so that less energy needs to be expended for the movement of the charge carriers.

While the contacting between electrodes and conductor tracks provided by the conductive paste can be utilized in a variety of different electronic circuits, the form of the contacting is especially advantageous for sensitive optoelectronic components such as OLEDs or organic solar cells in particular, since these react especially sensitively to applied heat and/or pressure, which are intrinsic to other contacting methods.

In one preferred embodiment, the electronic component comprises an organic light-emitting diode (OLED), having an anode, a cathode and a layered structure between the electrodes with at least one light-generating layer, as well as a voltage source for the operation of the OLED, and at least two conductor tracks are connected to the voltage source, while the layer of the conductive paste is present on the electrodes of the OLED and mediates a contacting to the conductor tracks.

In the sense of the invention, the term OLED preferably encompasses the rather well known organic light-emitting diodes of the prior art, which are characterized by a layered structure, comprising a light-generating layer between an anode and an electrode. For the operation of the OLED, it is necessary to connect it to a voltage source, with conductor tracks acting as the connection elements. Thanks to the connection to the voltage source, the charge carriers can be pumped into the photoactive layer in order to generate visible light. Preferably batters, capacitors, or also solar cells, especially organic solar cells, can be used as voltage sources.

Such an electronic component, especially due to the contacting, has a distinct improvement and boosted power as compared to similar components of the prior art. The technical progress provided in this way is accomplished by taking a new pathway.

Furthermore, the invention preferably relates to an electronic component, wherein the electronic component comprises an organic solar cell having an anode, a cathode and a layered structure between the electrodes with at least one light-absorbing layer, as well as a power consumer, and at least two conductor tracks are connected to the power consumer, while the layer of the conductive paste is present on the electrodes of the organic solar cell and mediates a contacting to the conductor tracks.

In the sense of the invention, the term organic solar cell preferably encompasses the rather well known solar cell of the prior arts of the prior art, which are characterized by a layered structure of at least partly semiconductor organic materials and especially an absorbing layer between an anode and an electrode. For the operation of an organic solar cell, it is necessary to connect it to a power consumer, preferably by means of conductor tracks. When visible light impinges on the solar cell, free charge carriers are generated as electron/hole pairs. By the connecting of a power consumer, the electric energy so provided can be tapped. Hence, the suitable power consumers are preferably both electronic components for the storage of the electrical energy, such as capacitors or batteries, and also electronic components which use the electric energy directly for processes, such as OLEDs for the generating of light signals. Such an electronic component comprising an organic solar cell has especially good robustness and freedom from maintenance. This is of especially high importance in the case of solar cells which are exposed to wind and weather and which generate current in permanent duty. Furthermore, solar cells whose electrodes are contacted in the described manner have a high efficiency.

It is thus preferably for the electronic component to comprise an optoelectronic component, preferably an OLED or an organic solar cell, which is connected across conductor tracks to a voltage source or a power consumer. The electronic component can furthermore preferably have further electronic components such as switches, sensors, and/or control electronics, where again a contacting according to the invention can also be used to advantage. Preferably, the electronic component is characterized by a sheetlike composition. That is, the thickness of the component is preferably significantly less than its length and/or width. For example, the electronic component may have a thickness of less than 1 mm. An electronic component of such thickness can be produced especially reliably and thus advantageously. It may likewise be preferable for the component to have a thickness of less than 0.3 mm, while its length and width may amount to several centimeters, so that a ratio of the thickness to the length or width of the component will preferably be more than 1:10, more than 1:50 or more than 1:100. Such a component contributes to the miniaturization of optoelectronic components. Thanks to the exceptional thinness, an especially esthetic effect can be accomplished.

In the sense of the invention, the term optoelectronic component is also used preferably to designate an OLED and/or an organic solar cell.

In these preferred embodiments, the contacting of the electrodes of the optoelectronic component occurs with the aid of the conductive paste. This constitutes, as mentioned above, an especially stable contacting, which is especially well suited to pressure and temperature-sensitive optoelectronic components. Whereas known contacting in the prior art requires high temperatures, as in soldering methods, or long drying times, as for FPC cables, the contacting according to the invention with the aid of the conductive pastes can do away with these drawbacks. In this way, faults can be effectively prevented in the optoelectronic components. The preferred electronic components are thus distinguished by an especially low fault rate. Furthermore, the contacting with the aid of the conductive pastes guarantees a long-lasting and stable connection, so that the optoelectronic components in the circuit have a long lifetime and also withstand large stresses, such as a bending of the component.

In one preferred embodiment of the invention, the electronic component is characterized in that the conductive paste is selected from a group comprising silver pastes, carbon pastes, and/or graphite pastes. These materials are especially well suited to producing a stable adhesive bonding between the electrodes and the conductor tracks. Furthermore, the properties of the aforementioned materials bring about the formation of especially advantageous electrical interfaces, i.e., boundary layers. This, the aforementioned conductive pastes enable the generating of an optimized electrical interface on the electrodes, so that the charge carriers in the case of an OLED can be injected more easily into the electrode or in the case of a solar cell they can be extracted with higher efficiency. This results in excellent efficiency coefficients for the optoelectronic components. Furthermore, the aforementioned materials can be processed in reliable manner and thus ensure a savings of time and labor. Moreover, the raw materials required for the materials are relatively easy to procure and can be recycled.

Furthermore, it has proven to be especially preferable to select for the conductive paste the same material as for the conductor track being contacted. That is, if the conductor tracks comprise silver, for example, then an especially efficient contacting will be realized with a silver paste as the conductive paste. This ensures that the energy levels of the contacting are adapted to those of the thin-layer components, thereby enhancing the effectiveness. Thus, for the same energy supplied, a higher yield can be achieved, for example the light produced in the case of the OLEDs, or the current in the case of the organic solar cells In one preferred embodiment, the electronic component is characterized in that a layer comprising conductive fiber composites is present between the conductive paste and the electrodes. Conductive fiber composites preferably mean composites having a metal and/or a metal alloy, which can produce an especially stable connection for example due to the fiberlike structuring of the conductive materials. A fiber composite comprises primarily two main components, an embedding matrix and reinforcing fibers. By mutual interactions of the two components, this material is given better properties than those of the two individually involved components in themselves, especially as regards the mechanical properties. Both the matrix and the fibers may consist of conductive materials, such as metals or graphite-like carbon. In this way, the stability of the contact between the electrodes and the conductor tracks can be significantly increased. Thus, the fiber composites can compensate for shear and compression forces in excellent manner on account of their structurizing. Hence, it is ensured that the contacting of the electronic component will not become damaged even under very large mechanical stresses. This is of special importance to the use of the electronic components for example for products which are carried on the body by the consumers, known as wearables in English. These may include watches, garments, and many other products. When the electronic components are integrated in such products, they are subjected to especially large mechanical stresses, so that a stable contacting with the aid of fiber composites becomes especially important. The component is especially reliable and maintenance-free.

It may likewise be preferable that the electronic component is characterized in that a conductive paste is present between the electrode and a layer comprising conductive fiber composites. Thus, the contact area between the electrode and the fiber composites can be increased. This produces a synergistic effect: the electrical conductivity is increased to a degree which is greater than would be expected from the electrical properties of the paste and the fiber composite in themselves. Likewise, the mechanical robustness of the contacting is improved.

In one preferred embodiment, the electronic component is characterized in that the fiber composites are selected from a group comprising nickel-copper (Ni—Cu) and/or silver-nickel-copper (Ag—Ni—Cu). The conductivity and mechanical stability of these materials allow an especially robust and efficient contacting of the electrodes with the conductor tracks. Fiber composites made of these materials have energy levels which are especially well adapted to a typical thin-layer component being contacted (such as an OLED). This, an especially good conductivity is assured across the contacting and the contacting contributes to the energy efficiency. A synergistic effect is achieved, since both the electrical properties (conductivity) and the mechanical properties (resistance to compressive, tensile and shear forces) are better than would be expected from the sole properties of the components involved.

In one preferred embodiment the electronic component is characterized in that the fiber composites are coated with conductive adhesives. In the sense of the invention, conductive adhesives preferably mean materials having in particular a high adhesivity to material comprising metals, and which on the other hand possess an adequate conductivity for electrical current. The skilled person is familiar with a number of conductive adhesives which can be used preferably. These include adhesives and resins, especially those based on acrylic, to which electrically conductive inorganic or organic particles have been added, such as silver, gold, palladium, nickel, graphite, and copper. Depending on the nature of the particles, especially their shape and symmetry, i.e., whether they are spheres or oblong or flat pieces, as well as their % share in the solution, these adhesives are either conductive in all three dimensions (XYZ) or only along the thickness of the adhesive tape (z). The use of fiber composites comprising such conductive adhesives has a synergistic effect, in that on the one hand they improve the mechanical robustness of the contacting, and on the other hand enhance the electrical conductivity of the contacting.

In this preferred embodiment there is furthermore produced an especially stable connection from the conductive paste to the adhesives present on the fiber composite.

Especially preferably, the fiber composites coated with adhesives that are used can be commercially available conductive adhesive tapes which are designed for the grounding of electronic components. For example, in particular the conductive adhesive tapes of the TESA company with product numbers 60260, 60262, 60272, 60252, 60251, 60234, 60233, 8455, 8456, 60255, 60256, 60257, 60253, 60254, 60274, 60258, 60214, 60246, 60215, 60248, 60249, 60216, 60217 and 60218 or conductive adhesive tapes of the 3M company with product numbers ECATT 7772, eCAP 7805, eCAP 7850, ECATT 9703, ECATT 9704, ECATT 9705, ECATT 9707, ECATT 9712, ECATT 9713, ECATT 9719, ECATT 9720, ECATT 9723, ECATT 9725, ECATT 9732, ECATT 9760, ECATT 9764, ECATT 9780, ECATT 9709S, ECATT 9722S, and ECATT 9711S are suitable to making possible the contacting. The use of such conductive adhesive tapes results in an especially simple construction of the contacting. They are reliable and costs can be saved by avoidance of costly contacting methods.

The application of the conductive paste surprisingly increases the conductivity of the conductive fiber composites coated with conductive adhesive, preferably the conductive adhesive tapes, and thus it improves the electrical contacting between the electrodes and the conductor tracks. Among other things, this is because the conductive paste is drawn into the layer of the adhesive and fiber composites and penetrates it. The resulting particularly mechanically and electrically stable contact has a surprising synergistic effect due to the combination of these two ingredients, going significantly beyond the expected advantages of the two individual ingredients taken together.

Surprisingly, the fiber composites coated with conductive adhesive, preferably the so-called conductive adhesive tapes, can mediate a stable contact even without the use of a conductive paste. The possibility of such a use of the conductive adhesive tapes for the contacting of electrodes with conductor tracks, especially those of optoelectronic components, is a surprising finding. In the prior art, the conductive adhesive tapes are used only for the grounding of electronic components or circuit boards. The possibility of a contacting so claimed, especially for optoelectronic components, has not been suggested.

In a further preferred embodiment, the invention relates to an electronic component comprising at least one electrode and at least one conductor track, wherein a contacting between the at least one electrode and the at least one conductor track occurs with the aid of a layer of conductive fiber composites, which are coated with conductive adhesives. Such a component is particularly simple, on the one hand as regards the manufacturing process, which ensures a cost savings, and on the other hand in its construction, which enhances the reliability and freedom from maintenance. Furthermore, such a component has especially diverse uses.

In a further preferred embodiment, the invention relates to an electronic component, wherein the electronic component comprises an organic light-emitting diode (OLED), having an anode, a cathode and a layered structure between the electrodes with at least one light-generating layer, as well as a voltage source for the operation of the OLED, and at least two conductor tracks are connected to the voltage source, while a contacting between the electrodes of the OLED and the conductor tracks occurs with the aid of a layer of conductive fiber composites, which is coated with conductive adhesives. The production of such a structure can be streamlined especially well and costs can be saved.

In a further preferred embodiment, the invention moreover relates to an electronic component, wherein the electronic component comprises an organic solar cell having an anode, a cathode and a layered structure between the electrodes with at least one light-absorbing layer, as well as a power consumer, and at least two conductor tracks are connected to the power consumer, while a contacting between the electrodes of the organic solar cell and the conductor tracks occurs with the aid of a layer of conductive fiber composites, which is coated with conductive adhesives. Such a construction has the advantage of great reliability and freedom from maintenance, which play a big role especially for a permanent duty of solar cells, which are exposed to wind and weather.

Surprisingly, a stable contacting even without a conductive paste can also be produced by means of conductive fiber composites which are coated with conductive adhesives. This contacting also eliminates the need for high temperature as in soldering methods or long drying times as in the case of FPC cables. In this way, the costs of the manufacturing of the component are reduced. The manufacturing of such a component can be especially easily streamlined. At the same time, the electronic component has a significantly longer lifetime, since the fiber composites provide a good adhesion and furthermore also withstand mechanical forces. The reliability is enormously boosted.

In a further preferred embodiment, the invention relates to an electronic component comprising at least two electrodes, wherein a contacting between the two electrodes occurs with the aid of a layer of conductive fiber composites, which is coated with conductive adhesives. In this embodiment, the layer of conductive fiber composites, which is coated with conductive adhesives, functions as a conductive bridge, so that no separate conductor track is needed. This embodiment may be used advantageously, for example, when optoelectronic components, such as OLEDs, are placed alongside each other and contacted directly via conductive adhesive tapes. Preferably each time an electrode of a first OLED is galvanically connected to an electrode of a second one by a conductive adhesive tape. In t his way, an especially high density of optoelectronic components in the electronic component can be realized. Furthermore, material can be saved in the manufacturing process. Time and costs are likewise spared. Such a design is especially simple, reliable, and maintenance-free. It represents a further alternative to known contacting methods.

The preferred embodiments disclosed for the fiber composites also hold for these embodiments. Thus, the fiber composites preferably comprise, e.g., nickel-copper (Ni—Cu) and/or silver-nickel-copper (Ag—Ni—Cu). These have an especially high conductivity and thus increase the capacity of the component. In particular, the commercially available conductive adhesive tapes can also be used. This can make the manufacturing cheaper.

While the conductive fiber composites already ensure a good conductive connection, tests have shown that in combination with the conductive paste the resistance at the interface, i.e., the boundary surface between the electrode and the adhesives, could be significantly decreased, so that an increased current flow is noticed. In this way, the luminous output of OLEDs can be significantly increased, for example. Surprisingly, two synergistic effects can be accomplished by the combination of paste and fiber composite: first, the electrical conductivity is increased more than would be assumed by the electrical properties of the individual components, and secondly a high flexibility is achieved by the combination of paste and fiber composite, at the same time as mechanical stability. These effects do not simply add up, but instead are stronger than the mechanical properties of the individual components might suggest.

The invention furthermore relates to a method for the contacting of an electrode with a conductor track, involving the following steps:
  providing an electrode
  applying a layer of a conductive paste to the electrode
  applying the conductor track on the conductive paste to make the contact.

The method enables the making of a stable contacting of an electrode with a conductor track on the basis of a conductive paste. The method can be used advantageously and preferably for the contacting of sensitive optoelectronic components, such as an OLED and/or an organic solar cell. The method results in an especially simple and robust contacting. At the same time, it is cheaper than other, more expensive methods. Since the method is gentle to the preferred optoelectronic components, the reject rate is lower and the method is more reliable.

In a further preferred embodiment, the invention thus relates to a method for the contacting of an OLED, involving the following steps:
  providing an OLED having an anode, a cathode and a layered structure between the electrodes with a light-generating layer
  providing a voltage source for the operation of the OLED
  applying the layer of the conductive paste to the electrodes of the OLED
  making a contacting by applying of conductor tracks, which are connected to the voltage source and/or will be so connected, on the conductive paste. In this way, an especially simple circuit can be provided for the operation of an OLED. The simplicity appears not only in the cost savings achieved, but also in the material savings, the reduced work stages, and the high reliability, which is favored by the less complicated layout.

In a further preferred embodiment, the invention relates to a method for the contacting of an organic solar cell involving the following steps:
  providing an organic solar cell having an anode, a cathode and a layered structure between the electrodes with an absorbing layer
  providing a power consumer for utilization of the electric energy provided by the organic solar cell,
  applying the layer of the conductive paste to the electrodes of the organic solar cell
  making a contacting by applying of conductor tracks, which are connected to the power consumer and/or will be so connected, on the conductive paste. An organic solar cell contacted by this method is especially robust and mechanically flexible. Therefore, such a solar cell has especially diversified uses. The lifetime is increased on account of the high reliability.

Surprisingly, however, a contacting may also be done even without the conductive paste, i.e., only by means of the adhesive-coated fiber composites. Such a layout is particularly simple and saves on material and work stages, and therefore costs in the manufacturing.

In a further preferred embodiment, the invention relates to a method for the contacting of an electrode with a conductor track, involving the following steps:
  providing an electrode
  applying a layer of fiber composites, which is coated with adhesives, to the electrodes
  applying the conductor track on the fiber composites, which are coated with adhesives, to make the contact. This contacting by means of fiber composites, which are coated with adhesives, also enables the construction of a stable galvanic connection and can be used preferably for optoelectronic components. The contacting with fiber composites has proven to be surprisingly robust. Even large mechanical stresses can be tolerated by the contacting. Thus, a component provided with contacting in this way is especially maintenance-free. The proposed method furthermore has many diversified uses.

In a further preferred embodiment, the invention relates to a method for the contacting of an OLED, involving the following steps:
  providing an OLED having an anode, a cathode and a layered structure between the electrodes with a light-generating layer
  providing a voltage source for the operation of the OLED
  applying of fiber composites, which are coated with adhesives, to the electrodes of the OLED
  making a contacting by applying of conductor tracks, which are connected to the voltage source and/or will be so connected, on the layer of the fiber composites. Surprisingly, an enormous improvement in the manufactured components has been found especially in the contacting of OLEDs by the proposed method. Besides the high stability of the circuit, the method results in an especially high-power OLED. This can be explained in particular by the high-power, large-area contact, which makes especially effective utilization of the area of the contacting and thus increases the conductivity.

In a further preferred embodiment, the invention relates to a method for the contacting of an organic solar cell involving the following steps:
  providing an organic solar cell having an anode, a cathode and a layered structure between the electrodes with an absorbing layer
  providing a power consumer for utilization of the electric energy provided by the organic solar cell,
  applying of fiber composites, which are coated with adhesives, to the electrodes of the organic solar cell making a contacting by applying of conductor tracks, which are connected to the power consumer and/or will be so connected, on the layer of the fiber composites. Here as well, the flat high-power contacting ensures an improved, more effective solar cell thanks to the high conductivity of this contacting. Likewise, the contacting is especially robust and mechanically sturdy, and therefore the entire circuit produced is especially reliable and long-lasting. This aspect plays a big role in particular in the use of solar cells.

However, it is most particularly preferred to combine the advantageous properties of the conductive paste with those of the adhesive-coated fiber composites to make a contact. The high performance and efficiency can thus be surprisingly improved. Likewise, the reliability of the overall component is enhanced.

In a further preferred embodiment, the invention therefore relates to a method for the contacting of an electrode with a conductor track involving the following steps:
  providing an electrode
  applying of a layer of a conductive paste to the electrode
  applying of fiber composites, which are coated with adhesives, to the conductive paste
  applying the conductor track on the fiber composites, which are coated with adhesives, to make the contact.

The circuit element so produced, which consists of an electrode and a conductor track making contact with each other, has surprising synergistic effects due to the combinations of the conductive paste and the self-adhesive fiber composite, which is likewise conductive. These are of two kinds: first of all, the electrical properties, meaning in particular the conductivity, are improved much more than the summation of the properties of the individual elements would suggest. Secondly, there is produced a combination of mechanical resistance to destruction when subjected to compressive, tensile and/or shear forces and simultaneous good flexibility, which is ideal for many applications, so that the element can be subjected to many kinds of deformations without becoming damaged. These mechanical properties are likewise improved much more than would be expected from the combination of the known properties of the individual elements.

In a further preferred embodiment, the invention relates to a method for the contacting of an OLED, involving the following steps:
  providing an OLED having an anode, a cathode and a layered structure between the electrodes with a light-generating layer
  providing a voltage source for the operation of the OLED
  applying of the layer of the conductive paste to the electrodes of the OLED
  applying of fiber composites, which are coated with adhesives, to the layer of the conductive paste
  making a contacting by applying of conductor tracks, which are connected to the voltage source and/or will be so connected, on the layer of the fiber composites. A circuit so produced, comprising an OLED, is especially high performing. In particular, there is the energy efficiency, which is increased by the especially conductive contact. A larger output of light generated can be achieved for the same electrical power given off. Moreover, a further means of contacting is provided as compared to the prior art, having its own benefits, consisting of the robustness, reliability, and freedom from maintenance, besides the high performance.

In a further preferred embodiment, the invention relates to a method for the contacting of an organic solar cell involving the following steps:
  providing an organic solar cell having an anode, a cathode and a layered structure between the electrodes with an absorbing layer
  providing a power consumer for utilization of the electric energy provided by the organic solar cell,
  applying of the layer of the conductive paste to the electrodes of the organic solar cell
  applying of fiber composites, which are coated with adhesives, to the layer of the conductive paste
  making a contacting by applying of conductor tracks, which are connected to the power consumer and/or will be so connected, on the layer of the fiber composites.

As compared to solar cells with other contacting, errors can be corrected and the quality enhanced. This is achieved in particular by the reliability of the contacting so achieved. Such a contacting on the one hand is mechanically stable and on the other hand distinguished by improved electrical properties. The conductivity is boosted and the yield of energy generated from the sunlight is higher.

In the aforementioned methods, it is especially preferable to perform the steps in the sequence mentioned. Thus, a streamlining of the method can be achieved especially easily, thereby saving time and costs. However, the skilled person knows that certain of the steps may also be performed in a different order. Thus, for example, at first the conductor tracks may be applied on the layer of the fiber composites. There may be process technology reasons for this, for example in order to correct production errors and raise the quality. It may also be preferable to undertake further steps of the method before, afterwards, or in between, in order to carry out the methods preferred in the sense of the invention, for example in order to improve the method.

As is evident to the skilled person, the aforementioned methods can preferably be used to produce an electronic component according to the invention or preferred embodiments thereof. The method according to the invention and the components according to the invention are thus connected by the idea of the new kind of contacting of electrodes with conductor tracks.

The skilled person will furthermore recognize that the preferred embodiments and their benefits, as disclosed for the electronic component, likewise hold for the method. Thus, for example, it was disclosed for the electrical component that preferred fiber composites are nickel-copper (Ni—Cu) and/or silver-nickel-copper (Ag—Ni—Cu), these being preferably coated with conductive adhesives. Thus, the skilled person will recognize that it is likewise preferable in the method according to the invention to employ these adhesive-coated fiber composites, wherein conductive adhesive tapes will especially preferably be used. Besides the benefits already disclosed for the component, further benefits will result, in particular the especially good processability of these materials, so that a time savings will be achieved in the manufacturing. Furthermore, the skilled person will likewise recognize that the preferred conductive pastes such as copper pastes, silver pastes, carbon pastes and/or graphite pastes which were disclosed for the electronic component will likewise find use advantageously in the method. In this way, the additional benefit results in the method that a contacting by means of these pastes can be especially easily streamlined and automated. The paste can be especially easily dispensed, resulting in a material savings as well as an improvement in the esthetic appearance of the component so contacted.

In one preferred embodiment of the invention, the method is characterized in that the applying of the conductive paste is done with the aid of a screen printing process, a stencil printing process, a dispenser and/or manually with the aid of a spade. These methods enable an especially precise dimensioning of the layer of the conductive paste and are furthermore cost-effective and easy to carry out. Furthermore, these steps are especially sparing to any sensitive electronic components which are present. Moreover, they are especially easy to streamline and automate.

In a further preferred embodiment of the invention, the method is characterized in that after the applying of the conductive paste it is smoothed out with the aid of a saddle. A saddle in this context is in particular an element especially suited to smoothing out the paste by virtue of its surface. In this way, an especially adherent connection can be achieved with the aid of the conductor tracks or with the layer of the fiber composites, since the paste is optimally adapted to these materials. Furthermore, it is possible to avoid paste protrusions which are visible to the naked eye and to improve the esthetic appearance of the contacting component in this way.

It is furthermore preferable that the electrically conductive paste dries out at room temperature, so that advantageously no heating is necessary. Hence, work steps can be spared in the contacting process.

In a further preferred embodiment of the invention, the method is characterized in that the applying of the adhesive-coated fiber composites is done with the aid of a manual positioning and/or with the aid of an automated positioning system. Surprisingly, these simple steps of the method are sufficient to connect the electrodes or the conductor tracks with the layer formed of fiber composites and adhesives. Preferably, no especially high pressures and/or temperature ranges are required. The automated positioning system ensures especially good results and large lot numbers. In English, this embodiment is also known as pick & place. This step of the method can likewise be especially easily streamlined and possibly automated.

In a combined use of the conductive paste with the adhesive-coated fiber composites it is furthermore preferable that the adhesive-coated fiber composites is applied to the conductive paste while it is not yet dried. In this way, the paste can penetrate into the layer of adhesives and fiber composites, making possible an excellent conductivity and an electrical interface especially for the injecting or extracting of charge carrier from optoelectronic components. Likewise, a connection made in this way is especially robust and reliable.

The providing of the OLED and the organic solar cell can preferably be accomplished by acquiring OLEDs or organic solar cells known in the prior art and contacting them according to the mentioned steps of the method. In the sense of the invention, contacting preferably means the mediating of a stable, electrically conductive connection between the electrodes and the conductor tracks. The method of the invention is therefore also preferably called a contacting method. Such a method constitutes the opening of a second pathway for contacting and offers an alternative by which an improvement of the prior art can be accomplished.

But the providing of the OLED and the organic solar cell can also occur by known production methods, wherein the steps for the contacting will follow the steps of the method for the production of the OLED and/or the organic solar cell. It was surprising that the steps of the contacting method can follow the known production methods without expense.

In a preferred embodiment of the invention, the method is characterized in that the OLED and/or the organic solar cell have a thin-layered structure and the providing of these is done by wet chemistry methods and/or a thermal vapor deposition method. These methods on the one hand are especially reliable, and on the other hand they can be very well streamlined. It is especially preferred to apply the layers by screen printing, spin coating, offset printing, and/or gravure printing. These methods afford a savings of time, material, labor and costs. It is most especially preferred to apply the layers with the aid of an inkjet printing method and the cathode and anode are especially preferably applied with a spraying method. This method is especially robust to minor deviations in the parameter settings and it affords an enhanced quality as compared to conventional methods.

In this method, it is advantageous to apply conductive inks on electrodes still moistened with silver prior to drying. This can further improve the conductivity of the electrodes and their contactability.

If a contacting of these electrodes is to be done, the use of slight pressure or a brief temperature of 120° C. may also be preferable. In this way, especially conductive and robust contacting can be achieved.

Preferably, wet chemistry methods are understood to be production processes in which the materials for the individual layers, such as the organic semiconductor polymers, are present in solutions and a coating is done with the aid of these solutions. The skilled person is familiar with suitable solvents as the vehicle for the respective components. By thermal vapor deposition is meant preferably vacuum-based coating methods wherein the materials for the layers are heated to a boiling point and thus vapor deposited on the respective substrates. Thanks to the mentioned methods, especially homogenous pure layers can be applied with well-defined extensions. The inkjet printing method for the layers between the electrodes and the spraying method for the electrodes are furthermore distinguished by especially low production costs and broad applicability on different substrates. Thanks to these methods, a thin, economical and efficient OLED or organic solar cell can be provided in flexible manner.

In a preferred embodiment of the invention, the method is characterized in that the providing of the conductor tracks is done by a printing method selected from a group comprising inkjet, screen printing, flexographic printing, and offset printing. Preferably silver and/or graphite are used as the printing materials. With the mentioned printing methods, especially thin, flexible and cost-effective conductor tracks can be produced. In this way, electronic circuits can be realized which are distinguished by good flexibility and extremely slight thickness. Because both the OLED and/or the organic solar cell and also the conductor tracks can be produced by printing methods, the production process is significantly simplified and streamlined.

With conventional contacting methods it is difficult to connect such printed conductor tracks and/or electrodes, especially those of printed OLEDs and/or organic solar cells. Advantageously, the method according to the invention makes possible a contacting in which even highly sensitive conductor tracks and/or optoelectronic components can be galvanically coupled together in a secure and stable manner. Furthermore, the applying of the conductive paste can also be readily combined with the steps of imprinting the electronic components.

Detailed Specification of the Invention

In the following, the invention will be explained more closely with the aid of examples, without being limited to these.

DETAILED DESCRIPTION OF THE FIGURES

Figure 1:
FIG. 1 Schematic representation of a preferred contacting of an OLED
Figure 1:
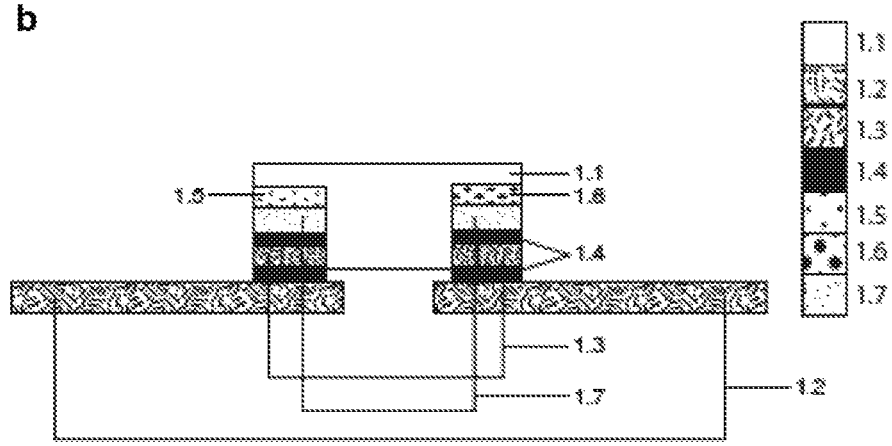

FIG. 1a, b shows a schematic representation of a preferred contacting of an OLED 1.1.

The OLED 1.1. has a thin-layered structure with at least one optically active emitter layer, which is arranged between two electrodes, an anode 1.5 and a cathode 1.6. In order to place the OLED 1.1 in operation, a contacting of the OLED 1.1. with conductor tracks 1.2 is done, being connected to a voltage source (not shown). For this purpose, fiber composites 1.3 coated on both sides with adhesives 1.4 are placed between the electrodes (1.5 and 1.6) and the conductor tracks 1.2. Preferably suitable conductive fiber composites 1.3 are, for example, Ni—Cu or Ag—Ni—Cu fiber composites. These make it possible to produce an especially stable and conductive contact between the conductor tracks 1.2 and the electrodes (1.5 and 1.6). For improved adhesion and formation of electrical interfaces favoring the charge carrier injection, the electrodes (1.5 and 1.6) are roughened. In the case of printed OLEDs 1.1, this surface modification may be done during the printing of the electrodes (1.5 and 1.6) by applying a conductive paste 1.7. But it may also be preferably to coat the OLEDs 1.1. with the conductive paste 1.7 after a placement. In this, copper pastes, silver pastes and/or graphite pastes will be used preferably, being applied preferably with a screen printing method. The conductive paste 1.7, as illustrated in FIG. 1b, preferably lies between the electrodes (1.5 and 1.6) and the fiber composites 1.3 coated with the adhesives 1.4. The galvanic contact between the fiber composites 1.3 and the conductor tracks 1.2 is preferably mediated by adhesive 1.4.

FIG. 1b shows a cross sectional representation of the preferred OLED 1.1, whose electrodes (1.5 and 1.6) have been connected to the conductor tracks 1.2. FIG. 1a shows a cross sectional representation of the fiber composites 1.3 coated with adhesives 1.4.

Figure 2:
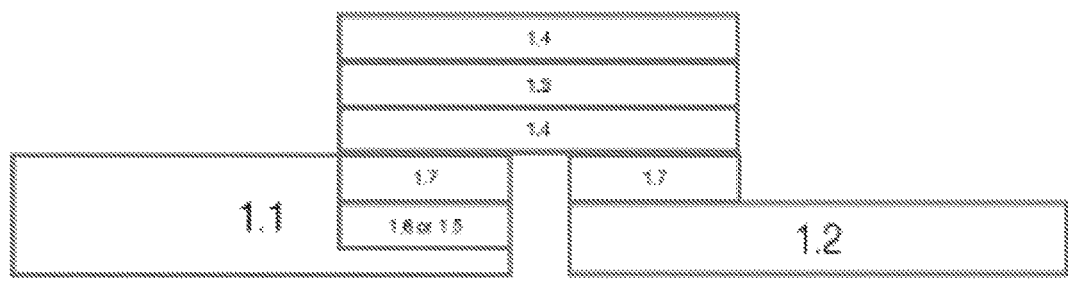
FIG. 2 Schematic representation of a preferred contacting of an OLED
Figure 2:
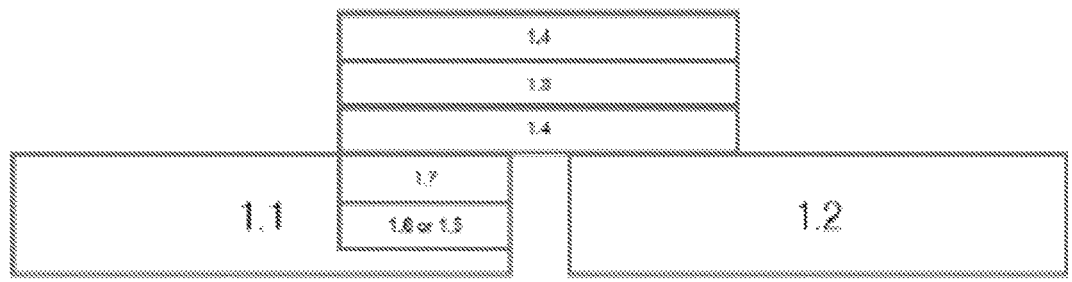
Figure 2:
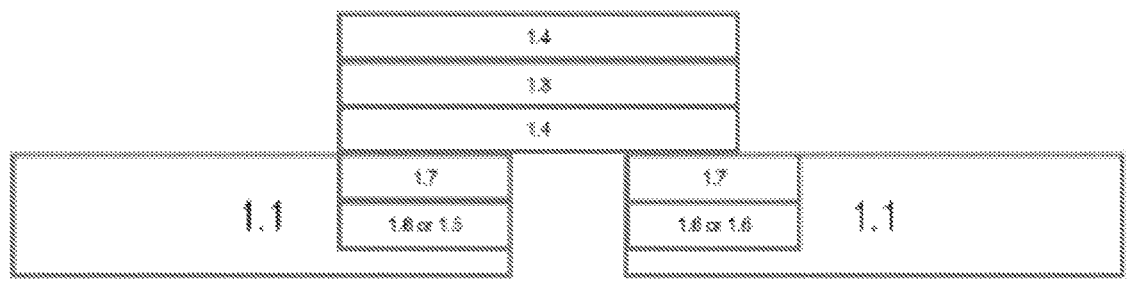

FIG. 2 shows a schematic representation of a further preferred contacting of an OLED 1.1. In embodiment shown, the optoelectronic component, i.e., the OLED 1.1, is present with the electrodes (1.5 and 1.6) on top, i.e., preferably toward the side facing away from the substrate. In this case, the contacting, as shown, is preferably realized by a bridging by fiber composites 1.3 coated with adhesives 1.4, preferably by a conductive adhesive tape.

FIG. 2a shows a contacting of an electrode (1.5 or 1.6) of the OLED 1.1 by means of fiber composites 1.3 coated with adhesives 1.4 to a conductor track 1.2, wherein the conductor track 1.2 and the electrode (1.5 or 1.6) are coated with a conductive paste 1.7.

FIG. 2b shows a contacting of an electrode (1.5 or 1.6) of the OLED 1.1 by means of fiber composites 1.3 coated with adhesives 1.4 to a conductor track 1.2, wherein the electrode (1.5 or 1.6) is coated with a conductive paste 1.7, but the contact to the conductor track 1.2 occurs without the applying of a conductive paste 1.7.

FIG. 2c shows a contacting of an electrode (1.5 or 1.6) of a first OLED 1.1 by means of fiber composites 1.3 coated with adhesives 1.4 to an electrode (1.5 or 1.6) of a second OLED 1.1. Preferably the electrodes (1.5 or 1.6) of the OLEDs each have a layer of conductive pastes 1.7.

It is pointed out that various alternatives to the described embodiments of the invention can be used to implement the invention and arrive at the solution according to the invention. The electronic component according to the invention as well as the method for the contacting of an electrode, preferably of an OLED and/or an organic solar cell, with conductor tracks are therefore not limited in their embodiments to the foregoing preferred embodiments. Instead, many variant embodiments are conceivable, which may differ from the represented solution. The aim of the claims is to define the protection scope of the invention. The protection scope of the claims is meant to cover the electronic component according to the invention and the method for the contacting according to the invention as well as equivalent embodiments thereof.

LIST OF REFERENCE NUMBERS 1.1 OLED
1.2 Conductor tracks
1.3 Conductive fiber composites
1.4 Adhesive
1.5 Anode
1.6 Cathode
1.7 Conductive paste

The invention claimed is:

1. An electronic component comprising at least one electrode and at least one conductor track, wherein a layer of a conductive paste is present on the electrode, by means of which a contacting to the conductor track occurs, and wherein furthermore the contacting between the at least one electrode and the conductor track occurs with the aid of a layer comprising a conductive fiber composite coated with adhesives, wherein the conductive paste is present between the electrode and the layer comprising the conductive fiber.

2. The electronic component of claim 1, wherein the electronic component comprises an organic light-emitting diode (OLED), having an anode, a cathode and a layered structure between the electrodes with at least one light-generating layer, as well as a voltage source for the operation of the OLED, and at least two conductor tracks are connected to the voltage source, while the layer of the conductive paste is present on the electrodes of the OLED and mediates a contacting to the conductor tracks.

3. The electronic component of claim 1, wherein the electronic component comprises an organic solar cell having an anode, a cathode and a layered structure between the electrodes with at least one light-absorbing layer, as well as a power consumer, and at least two conductor tracks are connected to the power consumer, while the layer of the conductive paste is present on the electrodes of the organic solar cell and mediates a contacting to the conductor tracks.

4. The electronic component of claim 1, wherein the conductive paste is selected from a group consisting of copper pastes, silver pastes, carbon pastes, and graphite pastes.

5. The electronic component of claim 1, wherein the fiber composite is selected from a group consisting of nickel-copper (Ni—Cu) and silver-nickel-copper (Ag—Ni—Cu).

6. An electronic component comprising at least two electrodes, wherein a contacting between the two electrodes and conductor tracks occurs with the aid of a layer of conductive fiber composites, which is coated with conductive adhesives.

7. A method for making a contact between an electrode and a conductor track, comprising:
providing an electrode;
applying a layer of a conductive paste to the electrode;
applying a layer of fiber composites coated with adhesives to the conductive paste; and
applying the conductor track on the fiber composites coated with adhesives to make the contact.

8. The method of claim 7 further comprising:
providing an OLED having an anode, a cathode and a layered structure of electrodes with a light-generating layer;
providing a voltage source for the operation of the OLED;
applying the layer of the conductive paste to the electrodes of the OLED;
applying the layer of fiber composites coated with adhesives to the layer of the conductive paste; and
applying the conductor tracks, which are configured to be connected to the voltage source, on the layer of the fiber composites.

9. The method of claim 7 further comprising:
providing an organic solar cell having an anode, a cathode and a layered structure of electrodes with an absorbing layer;
providing a power consumer for utilization of electric energy provided by the organic solar cell;
applying the layer of the conductive paste to the electrodes of the organic solar cell;
applying the layer of fiber composites coated with adhesives to the layer of the conductive paste; and
applying the conductor tracks, which are configured to be connected to the power consumer, on the layer of the fiber composites.

10. The method of claim 7, wherein applying the layer of the conductive paste is done with the aid of a screen printing process, a stencil printing process, a dispenser or manually with the aid of a spade.

11. The method of claim 7, wherein after applying the layer of the conductive paste it is smoothed out with the aid of a saddle.

12. The method of claim 7, wherein applying the layer of the adhesive-coated fiber composites is done with the aid of a manual positioning or with the aid of an automated positioning system.

13. The method of claim 8, wherein the OLED has a thin layer structure and the providing of the OLED is done by wet chemistry methods or a thermal vapor deposition method.

14. The method of claim 7, wherein the conductor track is provided by a printing method selected from a group consisting of inkjet, screen printing, flexographic printing, and offset printing.

15. The method of claim 13, wherein layers of the thin film structure are applied by screen printing, spin coating, offset printing, or gravure printing.

16. The method of claim 13, wherein layers of the thin film structure are applied with the aid of an inkjet printing method and the cathode and anode are applied with a spraying method.

17. The method of claim 9, wherein the organic solar cell has a thin layer structure and the providing of the organic solar cell is done by wet chemistry methods or a thermal vapor deposition method.

18. The method of claim 17, wherein the layers of the thin film structure are applied by screen printing, spin coating, offset printing, or gravure printing.

19. The method of claim 13, wherein the layers of the thin film structure are applied with the aid of an inkjet printing method and the cathode and anode are applied with a spraying method.

* * * * *